United States Patent [19]

Belfield et al.

[11] Patent Number: 4,654,863
[45] Date of Patent: Mar. 31, 1987

[54] WIDEBAND ADAPTIVE PREDICTION

[75] Inventors: William R. Belfield, Tinton Falls; Raymond S. Medaugh, Middletown, both of N.J.

[73] Assignee: AT&T Bell Laboratories, Murray Hill, N.J.

[21] Appl. No.: 737,330

[22] Filed: May 23, 1985

[51] Int. Cl.[4] .............................................. H04B 14/06
[52] U.S. Cl. .................................... 375/27; 332/11 D
[58] Field of Search ................... 375/27, 32; 364/724, 364/825; 381/29–35; 370/118; 332/11 D

[56] References Cited

U.S. PATENT DOCUMENTS

| | | | |
|---|---|---|---|
| 4,179,710 | 12/1979 | Ishigura et al. | 375/27 |
| 4,317,208 | 2/1982 | Araseki et al. | 375/27 |
| 4,319,360 | 3/1982 | Cointot | 332/11 D |
| 4,470,146 | 9/1984 | Yatsuzuka et al. | 332/11 D |
| 4,475,227 | 10/1984 | Belfield | 375/27 |
| 4,538,234 | 8/1985 | Honda et al. | 381/31 |

OTHER PUBLICATIONS

"Adaptive Quantization with a One-Word Memory", Bell System Technical Journal, vol. 52, No. 7, Sep. 1973, N. S. Jayant, pp. 1119–1144.
"32 kbit/s Adaptive Differential Pulse Code Modulation (ADPCM)", CCITT Study Group XVIII.

Primary Examiner—Robert L. Griffin
Assistant Examiner—M. Huseman
Attorney, Agent, or Firm—Thomas Stafford

[57] ABSTRACT

Superior performance, better tracking, and stability of an adaptive predictor are realized by employing a so-called high order (eighth) prediction filter and by updating the filter coefficients in accordance with an algorithm based on the sign of a reconstructed signal sample ($s_q(k)$) multiplied by a quantized version ($e_q(k)$) of a differential error signal normalized by an expected magnitude of the reconstructed signal sample.

16 Claims, 6 Drawing Figures

$\mu()$: $\mu 255$ CONVERSION FUNCTION
$\ell()$: LINEAR CONVERSION FUNCTION

WIDEBAND ADAPTIVE PREDICTION

TECHNICAL FIELD

The present invention relates to adaptive prediction in differential PCM coding of speech, music, voiceband data, and tones.

BACKGROUND OF THE INVENTION

Over the past several years there has been, and continues to be, a tremendous amount of activity in the area of efficient encoding of speech. For an evolving digital telephone network, a most important application is the possible replacement of the 64,000 bit-per-second (b/s) PCM signal (8 bits per time slot, repeated at an 8 kHz rate) with other coding algorithms for telphoney—both in the public switched and private line networks. The reason, of course, is to achieve bandwidth compression.

For a realistic mix of input speech, music and voiceband data, adaptive differential PCM appears to be a most promising approach. One form of adaptive differential PCM coding is disclosed, for example, in U.S. Pat. No. 4,437,087 issued Mar. 13, 1984 to D. W. Petr, and can be considered a benchmark since a single encoding with this ADPCM coder at 32 kb/s is near to being subjectively equivalent to 64 kb/s $\mu$255 PCM.

The prior adaptive predictors employed in the Petr coding arrangement are particularly advantageous in handling signals encountered in conventional telephone channels, i.e., signals up to 4 kHz. However, processing of so-called wideband signals, i.e., signals above 4 kHz, imposes more stringent requirements on the adaptive predictor. Indeed, wideband processing is intended to provide reduced distortion and noise with greater audio bandwidth as compared to conventional telephone transmission.

Prior predictor arrangements have performance limitations in the presence of transmission errors which result in a decoder not tracking a corresponding coder. Such mistracking results in degradation of the received signal. Moreover, wideband applications typically require so-called higher order filters in the predictor. Heretofore, maintaining tracking and stability of the higher order predictor filters was a problem.

SUMMARY OF THE INVENTION

The performance limitations and stability problems are overcome in an adaptive predictor for use in an adaptive differential PCM coder-decoder by employing, in accordance with an aspect of the invention, a high order prediction filter in which the prediction filter coefficients are updated in accordance with a predetermined relationship between a reconstructed sample ($s_q(k)$) and a quantized version ($e_q(k)$) of the differential error signal. More specifically, the filter coefficients are updated using an algorithm based on the sign of a reconstructed sample ($s_q(k)$) multiplied by a quantized version ($e_q(k)$) of the differential error signal ($e(k)$) normalized by the expected magnitude of the reconstructed sample ($s_q(k)$).

It is a feature of the invention that the above-described functions or operations can be carried out digitally and, therefore, an adaptive predictor designed in accordance with the invention can be readily implemented in integrated circuit form or, alternatively, through the use of a digital signal processor.

BRIEF DESCRIPTION OF THE DRAWING

The invention will be more fully understood from the following detailed description of an illustrative embodiment taken in connection with the appended figures in which.

DETAILED DESCRIPTION

Figure 1:
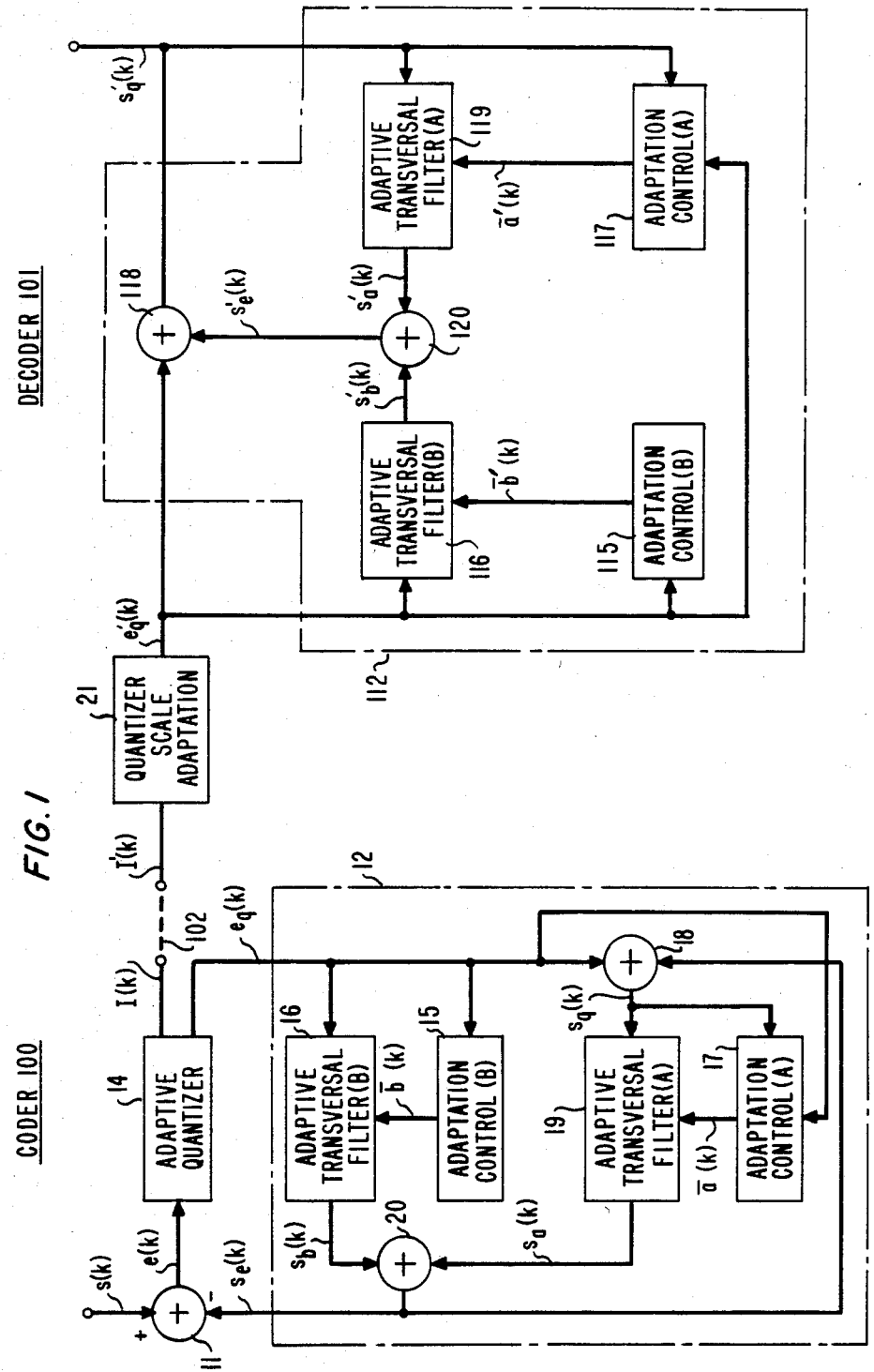
FIG. 1 shows in simplified block diagram form an ADPCM CODEC (coder-decoder) including the present invention.

FIG. 1 shows an ADPCM CODEC system in which adaptive prediction in accordance with the present invention can be used to advantage. Accordingly, coder 100 receives, in this example, linear PCM samples s(k) and encodes them into an n-bit differential PCM signal I(k) for transmission to ADPCM decoder 101 over transmission facility 102. For purposes of illustration, a 4-bit differential PCM signal is assumed. This 4-bit differential PCM signal I(k) in conjunction with the ADPCM coding algorithm provides very reliable transmission for both speech and wideband signals, e.g., music.

The multibit (e.g., 15-16 bits) linear PCM samples s(k) are supplied to one input of algebraic difference circuit 11. Samples s(k) could also be pulse amplitude modulated (PAM) samples. Linear PCM samples s(k) may result from the direct encoding of an input speech or music signal.

Adaptive predictor 12 provides a predicted signal $s_e(k)$ which is a prediction or estimate of sample s(k). This predicted signal $s_e(k)$ is supplied to the second input of difference circuit 11. Difference circuit 11 yields differential error signal e(k) which is the algebraic difference of the supplied inputs, namely, $$e(k) = s(k) - s_e(k). \tag{1}$$

The error signal e(k) is supplied to adaptive quantizer 14. Adaptive quantizer 14 is, in this example, a 16-level quantizer and not only provides the desired quantization of differential error signal e(k) to yield $e_q(k)$, but it also serves to PCM-encode the differential error signal to yield differential PCM output I(k). In this example, output I(k) is a 4-bit signal representing the quantized and PCM-encoded form of differential error signal e(k). Such quantizers are known in the art. See, for example, an article by N. S. Jayant entitled "Adaptive Quantization with a One-Word Memory", *The Bell System Technical Journal*, Vol. 52, No. 7, September 1973, pages 1119–1144.

The quantized version of differential error signal e(k), namely, $e_q(k)$, is supplied from quantizer 14 to predictor 12 and, therein, to adaptation control(B) 15, adaptive transversal filter(B) 16, adaptation control(A) 17 and one input of adder 18. The $s_e(k)$ output of predictor 12 is also supplied to the second input of adder 18. Adder 18 serves to add quantized signal $e_q(k)$ and predicted signal $s_e(k)$ to generate at its output reconstructed signal $s_q(k)$. Reconstructed signal $s_q(k)$ is a close quantized version of the input sample $s(k)$. Reconstructed signal $s_q(k)$ is supplied to adaptation control(A) 17 and to adaptive transversal filter(A) 19. Adaptation control(B) 15 generates coefficient update vector $\overline{b}(k)$ ($\overline{b}(k)=\{b_1(k), b_2(k), \ldots, b_n(k)\}$) for adaptive transversal filter(B) 16. Adaptation control(A) 17 generates, in accordance with an aspect of the invention, coefficient update vector $\overline{a}(k)$ ($\overline{a}(k)=\{a_1(k), a_2(k), \ldots, a_m(k)\}$) for high order adaptive transversal filter(A) 19. An output from adaptive transversal filter(B) 16, $s_b(k)$, and an output from adaptive transversal filter(A) 19, $s_a(k)$, are supplied to adder 20 which, in turn, yields the next predicted signal sample $s_e(k)$ for comparison with the next received linear PCM sample $s(k)$, namely, $$s_e(k) = s_a(k) + s_b(k). \quad (2)$$

The 4-bit differential PCM output signal $I(k)$ from quantizer 14 is transmitted, in typical time-division multiplexed fashion, over digital transmission facility 102 to decoder 101. The received signal is designated $I'(k)$, the prime indicating that it is close to and yet, perhaps, not identical with the transmitted signal $I(k)$ because of transmission errors. Similarly, the other letter symbols used in decoder 101 are primed to indicate that they are close to, but perhaps not identical with, the similarly designated symbols or signals of coder 100.

In decoder 101, received signal $I'(k)$ is supplied to quantizer scale adaptation unit 21 which generates at its output the quantized signal $e'_q(k)$. Such quantizer scale adaptation units are known in the art. See, for example, the N. S. Jayant article noted above. Again, as before, $e'_q(k)$ represents the quantized version of the differential error signal $e(k)$, with the prime indicating a possible variation therefrom because of transmission errors. The quantized differential error signal $e'_q(k)$ is supplied to adaptive predictor 112 and, therein, to adaptation control(B) 115, adaptive transversal filter(B) 116, adaptation control(A) 117 and one input of adder 118. An output from predictor 112 is the reconstructed signal $s'_q(k)$ which, again, is a close quantized version of the original sample $s(k)$ supplied to coder 100. The reconstructed signal $s'_q(k)$ is also supplied to predictor 112 and, therein, to adaptation control(A) 117 and adaptive transversal filter(A) 119. Adaptation control(B) 115 generates coefficient update vector $\overline{b}'(k)$ for adaptive transversal filter(B)116 and adaptation control(A) 117 generates, in accordance with an aspect of the invention, coefficient update vector $\overline{a}'(k)$ for adaptive transversal filter(A) 119. Filter 116 generates $s'_b(k)$ while filter 119 generates $s'_a(k)$, which are combined via adder 120 to generate the predicted sample $s'_e(k)$. Predicted sample $s'_e(k)$ is supplied to one input of adder 118 and the quantized differential error signal $e'_q(k)$ is supplied to a second input of adder 118. Adder 118 generates the reconstructed signal $s'_q(k)$, namely, $$s'_q(k) = e'_q(k) + s'_e(k). \quad (3)$$

The reconstructed signal $s'_q(k)$ is supplied to an output of decoder 101 where it is utilized to reconstruct a replica of the original speech or music signal.

Figure 2:
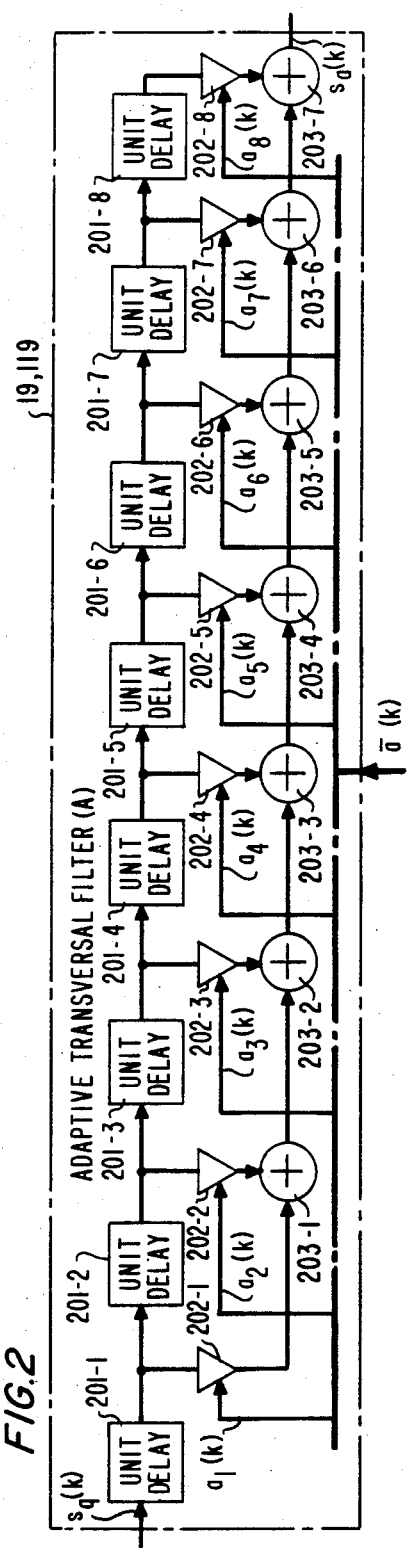
FIG. 2 depicts in simplified form details of adaptive filter(A) employed in the embodiment of FIG. 1.

FIG. 2 shows in simplified form details of adaptive transversal filter(A) 19, 119 employed in both encoder 100 and decoder 101 of FIG. 1. In this example, the number of filter coefficients, $a_i(k)$, used in filter 19, 119 is assumed to be eight (8). Accordingly, filter 19, 119 is a so-called high order filter which generates output $s_a(k)$ in response to reconstructed signal $s_q(k)$ and the filter(A) coefficients $a_i(k)$, namely, $$s_a(k) = \sum_{i=1}^{m} a_i(k) s_q(k - i), \quad (4)$$

where in this example $m=8$. To this end, filter 19, 119 includes a delay line consisting of a serial connection of delay units 201-1 through 201-8. Each of delay units 201 has a predetermined delay interval which, in this example, in the PCM sample interval. Outputs from delay units 201-1 through 201-8 are supplied to inputs of controllable gain units 202-1 through 202-8, respectively. Controllable gain units 202-1 through 202-8 are each responsive to a corresponding amplitude coefficient signal from adaptation control(A) 17, 117, namely, $a_1(k)$ through $a_8(k)$, respectively, to generate an updated amplitude signal. The amplitude signal outputs from controllable gain units 202-1 through 202-8 are appropriately summed via summers 203-1 through 203-7 to yield the desired output $s_a(k)$ in accordance with equation (4).

Figure 3:
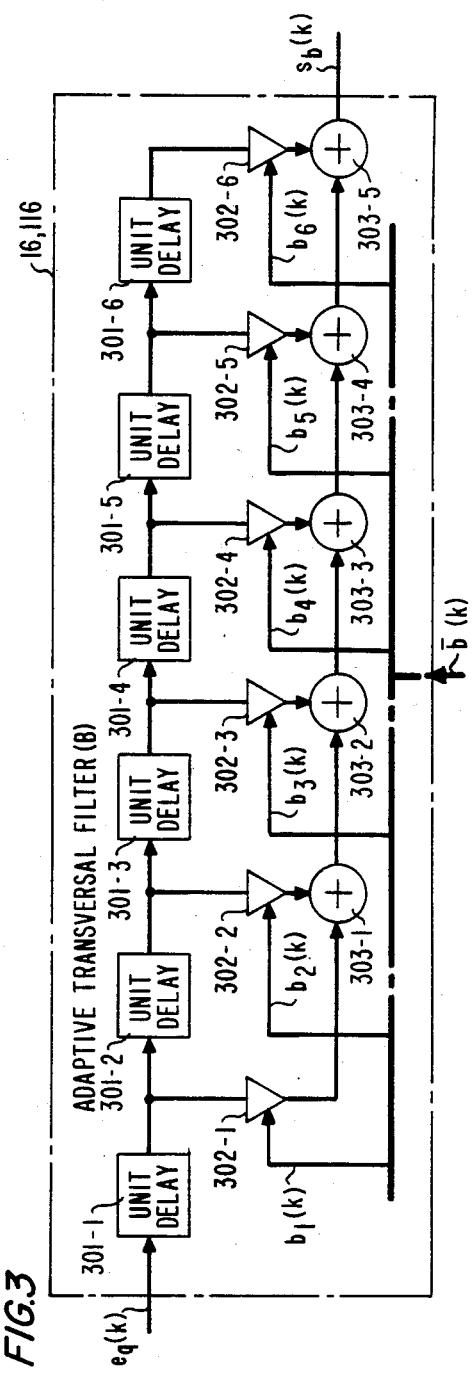
FIG. 3 shows in simplified form details of adaptive filter(B) also employed in the embodiment of FIG. 1.

FIG. 3 also shows in simplified block diagram form details of adaptive transversal filter(B) 16, 116 employed in both encoder 100 and decoder 101. In this example, the number of filter coefficients $b_i(k)$ used in filter 16, 116 is assumed to be six (6). Accordingly, filter 16, 116 generates output $s_b(k)$ in response to the quantized differential error signal $e_q(k)$ and the filter(B) coefficients $b_i(k)$, namely, $$s_b(k) = \sum_{i=1}^{n} b_i(k) e_q(k - i). \quad (5)$$

In this example $n=6$. To this end, filter 16, 116 includes a delay line consisting of a serial connection of delay units 301-1 through 301-6. Each of delay units 301 has a predetermined delay interval which, in this example, is the PCM sampling interval. Outputs from delay units 301-1 through 301-6 are supplied on a one-to-one basis to inputs of controllable gain units 302-1 through 302-6, respectively. Controllable gain units 302-1 through 302-6 are each responsive to a corresponding amplitude coefficient signal from adaptation control(B) 15, 115, namely, $b_1(k)$ through $b_6(k)$, respectively, to generate an updated amplitude signal. The updated amplitude signals from gain units 302-1 through 302-6 are appropriately summed via summers 303-1 through 303-5 to yield the desired output $s_b(k)$, in accordance with equation (5).

Adaptation control(B) 15, 115 is responsive to the quantized error signal $e_q(k)$ for generating the filter coefficient vector $\overline{b}(k)$ in known fashion. One predictor arrangement using $i=1, 2, \ldots 6$ which may be employed for adaptation control(B) 15, 115 is described in a CCITT STUDY GROUP XVIII document entitled "32k bit/s Adaptive Differential Pulse Code Modulation (ADPCM)", Temporary Document No. 4-E, 21-25, November 1983.

Figure 4:
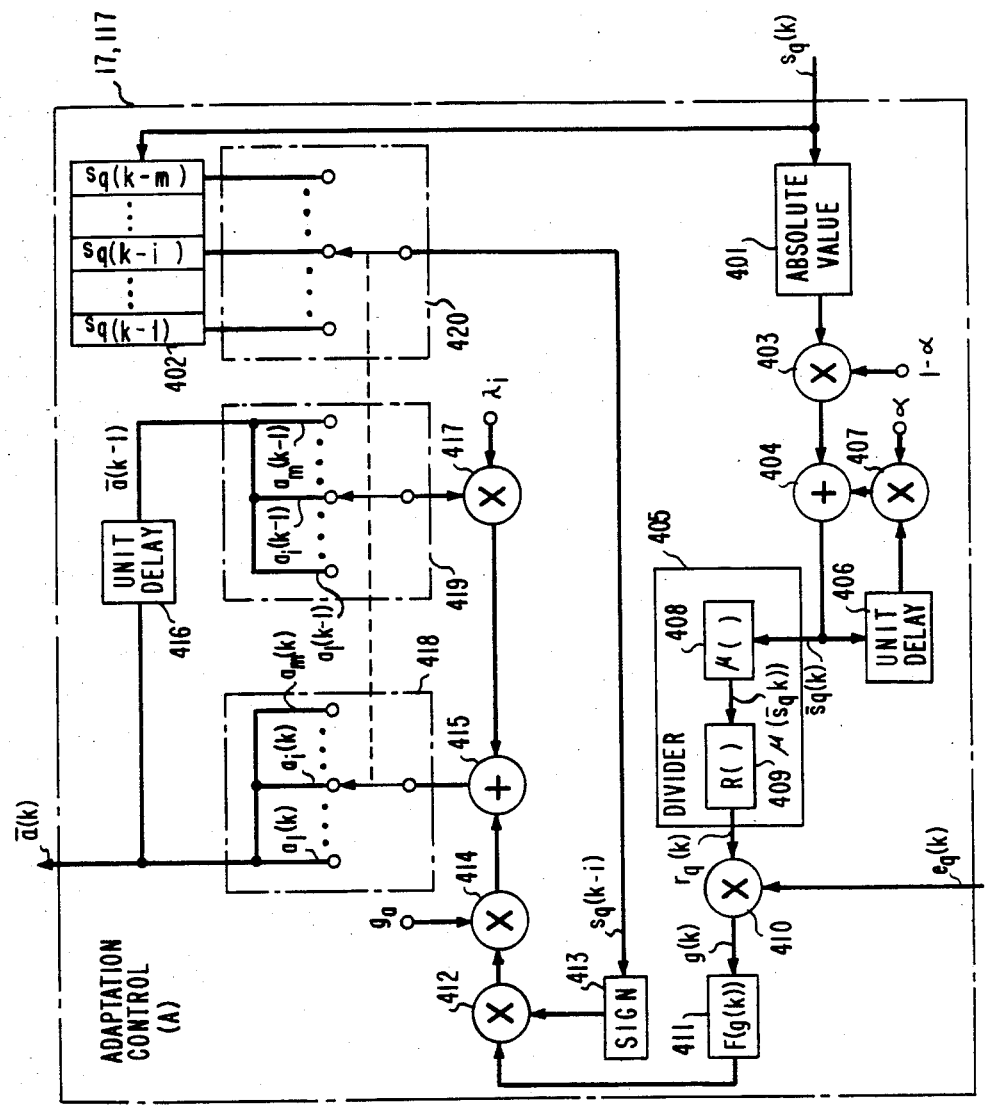
FIG. 4 depicts in simplified block diagram form details of adaptation control(A) of FIG. 1.

FIG. 4 depicts in simplified block degree form details of adaptation control(A) 17, 117 which generates filter amplitude coefficient, $a_i(k)$, in accordance with an aspect of the invention. That is to say, adaptation control(A) 17, 117 updates the filter coefficient vector $\overline{a}(k)$ of higher order filter 19, 119 by using an algorithm based on the sign of reconstructed sample $s_q(k)$ multiplied by the quantized differential error signal $e_q(k)$ normalized by the expected magnitude of reconstructed sample $s_q(k)$, namely, $$a_i(k) = \lambda_i a_i(k-1) + \frac{g_a \text{sign}(s_q(k-i))\, e_q(k)}{E\{|s_q(k)|\}} \quad (6)$$

The quantity, $e_q(k)/E\{|s_q(k)|\}$ of equation (6) can be considered a normalized error signal because the actual quantized error signal sample, $e_q(k)$, is scaled by the expected magnitude of the reconstructed signal sample, $E\{|s_q(k)|\}$. If the prediction filter signal estimate is very good, then the normalized error signal is relatively small. This implies that the coefficient update term of equation (6) is relatively small. Consequently, the effects of transmission errors on the predictor adaptation are reduced.

Figure 5:
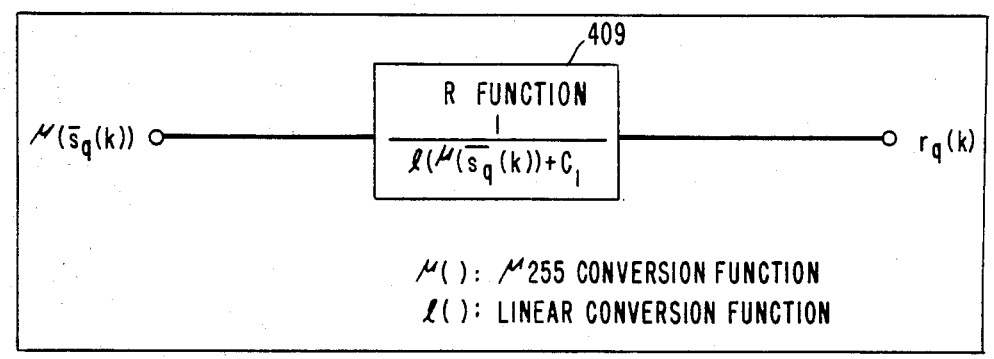
FIG. 5 shows in simplified form details of the R( ) function of FIG. 4.
Figure 6:
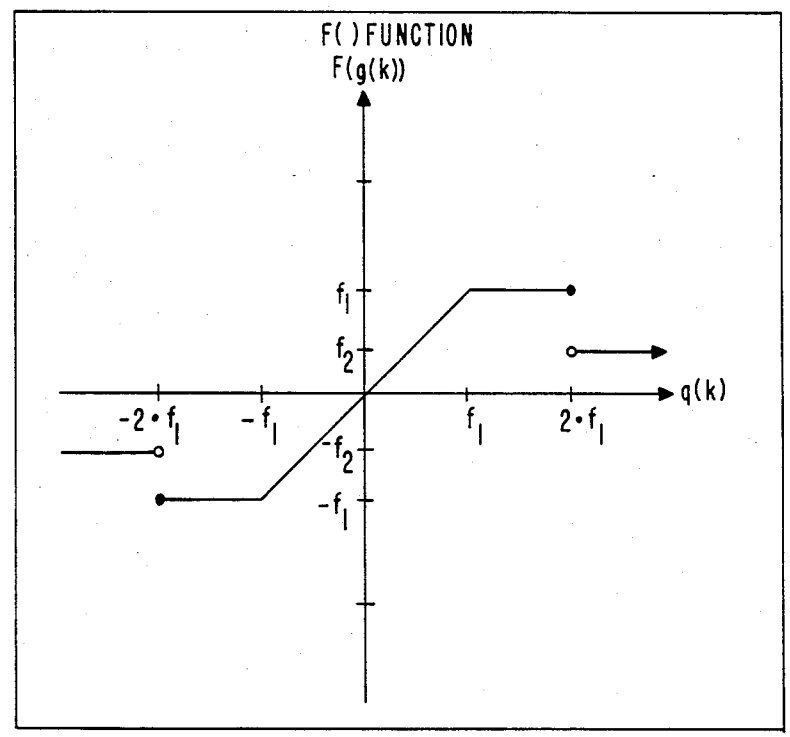
FIG. 6 shows in graphical form the F( ) function of FIG. 4.

In certain implementations, for example, those using a digital signal processor (DSP) chip, the function of equation (6) is modified. This is because division is not readily performed in the DSP chip. Instead the value of $1/E\{|s_q(k)|\}$ of equation (6) is approximated by using a table of reciprocals. An index of this table is found by using the $\mu$-law 255 PCM function. The table contains quantized reciprocal values of an estimate of $E\{|s_q(k)|\}$. In addition, limiting of the update term of equation (6) improves performance under conditions of transmission bit errors. The modified prediction filter coefficient adaptation procedure is $$a_i(k) = \lambda_i a_i(k-1) + g_a \,\text{sign}\,(s_q(k-i)) F(e_q(k) r_q(k)) \quad (7)$$

for $i=1, 2, \ldots m$ and where $F(\ )$ is a nonlinear function of $e_q(k) r_q(k)$. The function, $F(\ )$, is shown in FIG. 6 and is given by $$F(\ ) = \begin{cases} e_q(k) r_q(k), & \text{if } |e_q(k) r_q(k)| \leq f_1 \\ f_1 \text{sign}(e_q(k)), & \text{if } 2f_1 > |e_q(k) r_q(k)| > f_1 \\ f_2 \text{sign}(e_q(k)), & \text{if } |e_q(k) r_q(k)| \geq 2f_1 \end{cases} \quad (8)$$

where $$r_q(k) = \frac{1}{l\{\mu\,(\bar{s}_q(k))\} + c_1} \quad (9)$$

and $r_q(k)$ is schematically shown in FIG. 5. Letting $x = \bar{s}_q(k)$, the function $\mu(x)$ is, in this example, a $\mu 255$ PCM conversion function where x is a positive linear representation in the appropriate range. The function $l(y)$ is the linear conversion function where $y = \mu(x)$. The sequence $\bar{s}_q(k)$ is an estimate of the expected magnitude of the reconstructed signal $s_q(k)$ obtained by the average filter $$\bar{s}_q(k) = \alpha \bar{s}_q(k-1) + (1-\alpha)|s_q(k)|. \quad (10)$$

The parameter $\lambda_i$ of equation (7) is a so-called "leak" factor associated with $a_i(k)$ and $0 < \lambda_i < 1$. The parameter $\alpha$ of equation (10) is the average filter coefficient where $0 < \alpha < 1$.

It is seen that the update term of equation (7) is a nonlinear function of $e_q(k) r_q(k)$. The range of the function, $F(\ )$, is limited in order to provide better performance under conditions of transmission errors. It was found that the best overall performance was obtained with $f_2 < f_1$. One effect of this type of limiting is that the signal-to-noise ratio (SNR) performance for signals corresponding to relatively small normalized errors is better than the SNR performance for other signals. This performance characteristic takes advantage of certain subjective effects to provide good quality for a large class of signals. Subjectively, quantizing noise is generally more perceptible with narrowband signals and signals with strong spectral peaks than with broadband signals without spectral peaks. This is a result of noise masking effects. Therefore, since the normalized error is relatively small for signals with strong spectral peaks compared with other signals, the prediction filter performance characteristics match the observed subjective criterion. Another advantage of such limiting is that if a transmission error causes the value of $e_q(k)$ to increase significantly, then the limiting will tend to suppress the effects on the adaptation update term. Therefore, this adaptation technique provides good performance under conditions with transmission errors as well as under normal conditions.

Accordingly, shown in FIG. 4 is one embodiment of adaptation control(A) 17, 117 which generates filter coefficient vector $\bar{a}(k)$ in accordance with equation (6). To this end, reconstructed signal $s_q(k)$ is supplied to absolute value unit 401 and to buffer 402. Buffer 402 includes a plurality of stages equal to m, which in this example is eight (8). $s_q(k)$ is supplied from absolute value unit 401 to one input of multiplier 403 wherein it is multiplied by $1-\alpha$ to yield $(1-\alpha)\,s_q(k)$ which, in turn, is supplied to summer 404. The output of summer 404 is $\bar{s}_q(k)$ which is supplied to divider 405 and via unit delay 406 to multiplier 407. The unit delay interval of 406 is one (1) sampling interval and, thus, delay 406 yields $\bar{s}_q(k-1)$. Also supplied to multiplier 407 is constant $\alpha$. Multiplier 407 yields $\alpha \bar{s}_q(k-1)$ which is supplied to a second input of summer 404. Divider 405 includes $\mu 255$ conversion function 408 and the R( ) function 409 which approximates the division function by doing a table look-up to yield $r_q(k)$ which, in turn, is supplied to multiplier 410. Also supplied to multiplier 410 is the quantized error signal $e_q(k)$. The output of multiplier 410 is $$g(k) = e_q(k) r_q(k). \quad (11)$$

The signal $g(k)$ is supplied to nonlinear functions $F(\ )$ generator 411 which yields an output in accordance with FIG. 6 and which output is supplied to multiplier 412. The outputs from buffer 402 are supplied to switch 420. The output of switch 420 is $s_q(k-i)$ for $i=1, 2 \ldots$ m, and is supplied to sign function circuit 413. The number of stages of buffer 402 is, in this example, m=8. Sign function circuit 413 obtains the sign of $s_q(k-i)$ and supplies it to multiplier 412. Thus, multiplier 412 yields sign $(s_q(k-i))\, F(e_q(k) r_q(k))$ which is supplied to multiplier 414 where it is multiplied by constant $g_a$. Thus, $g_a$ sign $(s_q(k-i))\, F(e_q(k) r_q(k))$ is supplied to a first input of summer 415. The output of summer 415 is $a_i(k)$, where $i=1, 2, \ldots, m$ in sequence and, in this example, m=8. The output from summer 415 supplies the filter coefficients sequentially through switch 418 and circuit paths labeled $a_1(k)$ through $a_m(k)$ where $i=1, 2 \ldots m$ and, in this example, m=8. In turn, in this example, the filter coefficient vector $\bar{a}(k)$ is supplied to unit delay 416 and to the filter 19 (FIG. 2). The output of unit delay 416 is $\bar{a}(k-1)$ which is supplied to switch 419. Switch 419 supplies $a_i(k-1)$ to multiplier 417. Parameter $\lambda_i$ is also supplied to multiplier 417 to yield $\lambda_i a_i(k-1)$ which, in turn, is supplied to a second input of summer 415.

In one example not to be construed as limiting the scope of the invention $f_1 = 0.0625$
$f_2 = 0.0264423$
$g_a = 0.0063477$
$\alpha = 0.8$
$c_1 = 4.$

What is claimed is:

1. An adaptive predictor for use in an adaptive differential PCM system including
    means for algebraically combining a supplied sample and a predicted signal sample to generate a differential error signal sample, and
    means for generating a quantized version of the differential error signal sample, the predictor comprising,
    a first n-tap adaptive transversal filter,
    a first adaptation control circuit for providing tap coefficients for said n-tap adaptive transversal filter,
    a second m-tap adaptive transversal filter,
    a second filter adaptation control circuit for providing tap coefficients to said second m-tap adaptive transversal filter,
    means for algebraically combining outputs of said first and second transversal filters to form said predicted signal sample,
    means for algebraically combining said quantized version of said differential error signal sample and said predicted signal sample to form a reconstructed signal sample,
    wherein said second filter adaptation control circuit generates said second adaptive transversal filter tap coefficients in accordance with a predetermined relationship based on the sign of said reconstructed signal sample multiplied by said quantized version of said differential error signal sample which is normalized by a value representative of an expected magnitude of said reconstructed signal sample.

2. The invention as defined in claim 1 wherein m is greater than n.

3. The invention as defined in claim 2 wherein 5 m is eight (8).

4. The invention as defined in claim 2 wherein n is six (6).

5. An adaptive predictor for use in an adaptive differential PCM system including
    means for algebraically combining a supplied sample and a predicted signal sample to generate a differential error signal sample, and
    means for generating a quantized version of the differential error signal sample, the predictor comprising,
    a first n-tap adaptive transversal filter,
    a first adaptation control circuit for providing tap coefficients for said n-tap adaptive transversal filter,
    a second m-tap adaptive transversal filter,
    a second filter adaptation control circuit for providing tap coefficients to said second m-tap adaptive transversal filter,
    means for algebraically combining outputs of said first and second transversal filters to form said predicted signal sample,
    means for algebraically combining said quantized version of said differential error signal sample and said predicted signal sample to form a reconstructed signal sample,
    wherein said second filter adaptation control circuit generates said second adaptive transversal filter tap coefficients in accordance with the equation $$a_i(k) = \lambda_i a_i(k-1) + g_a \text{ sign } (s_q(k-i)) F(e_q(k) r_q(k))$$

where $a_i(k)$ are said second adaptive transversal filter tap coefficients, $i = 1, 2, 3 \ldots m$, $\lambda_i$ is a so-called predetermined leak factor, $g_a$ is a predetermined constant, $s_q(k)$ is the reconstructed signal sample, $e_q(k)$ is the quantized version of the differential error signal and $F(e_q(k) r_q(k))$ is a prescribed nonlinear relationship.

6. The invention as defined in claim 5 wherein the prescribed nonlinear relationship $F(e_q(k) r_q(k))$ is given by $$F(\ ) = \begin{cases} e_q(k) r_q(k), & \text{if } |e_q(k) r_q(k)| \leq f_1 \\ f_1 \text{sign}(e_q(k)), & \text{if } 2f_1 > |e_q(k) r_q(k)| > f_1 \\ f_2 \text{sign}(e_q(k)), & \text{if } |e_q(k) r_q(k)| \geq 2f_1 \end{cases}$$

where $f_1$ is a predetermined limiting factor, $f_2$ is a predetermined limiting factor and $r_q(k)$ is given by the equation $$r_q(k) = \frac{1}{l\{\mu\ (\bar{s}_q(k))\} + c_1}$$

where $c_1$ is a predetermined constant, $l$ is a linear conversion function, $\mu$ is a $\mu$-law 255 PCM conversion function and $\bar{s}_q(k)$ is a predetermined averaging filter function.

7. The invention as defined in claim 6 wherein said predetermined averaging filter function is given by the equation $$\bar{s}_q(k) = \alpha \bar{s}_q(k-1) + (1-\alpha)|s_q(k)|$$

where $\alpha$ is a predetermined coefficient.

8. The invention as defined in claim 5 wherein m is greater than n.

9. The invention as defined in claim 8 wherein m is eight (8).

10. The invention as defined in claim 8 wherein n is six (6).

11. An adaptive predictor for use in an adaptive differential PCM system including
    means for generating a quantized version of a differential error signal sample from a received digital signal sample, the predictor comprising,
    a first n-tap adaptive transversal filter,
    a first adaptation control circuit for providing tap coefficients for said n-tap adaptive transversal filter,
    a second m-tap adaptive transversal filter,
    a second filter adaptation control circuit for providing tap coefficients to said second m-tap adaptive transversal filter,
    means for algebraically combining outputs of said first and second transversal filters to form a predicted signal sample,
    means for algebraically combining said quantized version of said differential error signal sample and said predicted signal sample to form a reconstructed signal sample,
wherein said second filter adaptation control circuit generates said second adaptive transversal filter tap coefficients in accordance with the equation $$a_i(k) = \lambda_i a_i(k-1) + g_a \operatorname{sign}(s_q(k-i)) F(e_q(k) r_q(k))$$

where $a_i(k)$ are said second adaptive transversal filter tap coefficients, $i = 1, 2, 3 \ldots m$, $\lambda_i$ is a so-called predetermined leak factor, $g_a$ is a predetermined constant, $s_q(k)$ is the reconstructed signal sample, $e_q(k)$ is the quantized version of the differential error signal and $F(e_q(k) r_q(k))$ is a prescribed nonlinear relationship.

12. The invention as defined in claim 11 wherein the prescribed nonlinear relationship $F(e_q(k) r_q(k))$ is given by $$F(\ ) = \begin{cases} e_q(k) r_q(k), & \text{if } |e_q(k) r_q(k)| \leq f_1 \\ f_1 \operatorname{sign}(e_q(k)), & \text{if } 2f_1 > |e_q(k) r_q(k)| > f_1 \\ f_2 \operatorname{sign}(e_q(k)), & \text{if } |e_q(k) r_q(k)| \geq 2f_1 \end{cases}$$

where $f_1$ is a predetermined limiting factor, $f_2$ is a predetermined limiting factor and $r_q(k)$ is given by the equation $$r_q(k) = \frac{1}{l\{\mu(\bar{s}_q(k))\} + c_1}$$

where $c_1$ is a predetermined constant, $l$ is a linear conversion function, $\mu$ is a $\mu$-law 255 PCM conversion function and $\bar{s}_q(k)$ is a predetermined averaging filter function.

13. The invention as defined in claim 12 wherein said predetermined averaging filter function is given by the equation $$\bar{s}_q(k) = \alpha \bar{s}_q(k-1) + (1-\alpha)|s_q(k)|$$

where $\alpha$ is a predetermined coefficient.

14. An adaptive predictor for use in an adaptive differential PCM system including
means for generating a quantized version of a differential error signal sample from a received digital signal sample, the predictor comprising,
a first n-tap adaptive transversal filter,
a first adaptation control circuit for providing tap coefficients for said n-tap adaptive transversal filter,
a second m-tap adaptive transversal filter,
a second filter adaptation control circuit for providing tap coefficients to said second m-tap adaptive transversal filter,
means for algebraically combining outputs of said first and second transversal filters to form a predicted signal sample,
means for algebraically combining said quantized version of said differential error signal sample and said predicted signal sample to form a reconstructed signal sample,
wherein said second filter adaptation control circuit generates said second adaptive transversal filter tap coefficients in accordance with a predetermined relationship based on the sign of said reconstructed signal sample multiplied by said quantized version of said differential error signal sample which is normalized by a value representative of an expected magnitude of said reconstructed signal sample.

15. An adaptive predictor for use in an adaptive differential PCM system including
means for algebraically combining a supplied sample and a predicted signal sample to generate a differential error signal sample, and
means for generating a quantized version of the differential error signal sample, the predictor comprising,
a first n-tap adaptive transversal filter,
a first adaptation control circuit for providing tap coefficients for said n-tap adaptive transversal filter,
a second m-tap adaptive transversal filter,
a second filter adaptation control circuit for providing tap coefficients to said second m-tap adaptive transversal filter,
means for algebraically combining outputs of said first and second transversal filters to form said predicted signal sample,
means for algebraically combining said quantized version of said differential error signal sample and said predicted signal sample to form a reconstructed signal sample,
wherein said second filter adaptation control circuit generates said second adaptive transversal filter tap coefficients in accordance with the equation $$a_i(k) = \lambda_i a_i(k-1) + \frac{g_a \operatorname{sign}(s_q(k-i)) \, e_q(k)}{E\{|s_q(k)|\}}$$

where $a_i(k)$ are said second adaptive transversal filter tap coefficients, $i = 1, 2, 3 \ldots m$, $\lambda_i$ is a so-called predetermined leak factor, $g_a$ is a predetermined constant, $s_q(k)$ is the reconstructed signal sample, $e_q(k)$ is the quantized version of the differential error signal and $E\{|s_q(k)|\}$ is the expected magnitude of $s_q(k)$.

16. An adaptive predictor for use in an adaptive differential PCM system including
means for generating a quantized version of a differential error signal sample from a received digital signal sample, the predictor comprising,
a first n-tap adaptive transversal filter,
a first adaptation control circuit for providing tap coefficients for said n-tap adaptive transversal filter,
a second m-tap adaptive transversal filter,
a second filter adaptation control circuit for providing tap coefficients to said second m-tap adaptive transversal filter,
means for algebraically combining outputs of said first and second transversal filters to form a predicted signal sample,
means for algebraically combining said quantized version of said differential error signal sample and said predicted signal sample to form a reconstructed signal sample,
wherein said second filter adaptation control circuit generates said second adaptive transversal filter tap coefficients in accordance with the equation $$a_i(k) = \lambda_i a_i(k-1) + \frac{g_a \operatorname{sign}(s_q(k-i)) \, e_q(k)}{E\{|s_q(k)|\}}$$

where $a_i(k)$ are said second adaptive transversal filter tap coefficients, $i = 1, 2, 3 \ldots m$, $\lambda_i$ is a so-called predetermined leak factor, $g_a$ is a predetermined constant, $s_q(k)$ is the reconstructed signal sample, $e_q(k)$ is the quantized version of the differential error signal and $E\{|s_q(k)|\}$ is the expected magnitude of $s_q(k)$.

* * * * *